United States Patent [19]
Aikens

[11] Patent Number: 5,485,005
[45] Date of Patent: Jan. 16, 1996

[54] COOLED X-RAY SENSITIVE PHOTOCONDUCTOR

[75] Inventor: Richard S. Aikens, Tucson, Ariz.

[73] Assignee: Xicon, Inc., Tucson, Ariz.

[21] Appl. No.: 260,119

[22] Filed: Jun. 15, 1994

[51] Int. Cl.[6] ................................................. H01J 40/14
[52] U.S. Cl. ........................... 250/214 VT; 313/364; 250/370.15
[58] Field of Search ..................... 250/208.1, 214 VT, 250/370.15; 378/28, 98.2; 313/364

[56] References Cited

U.S. PATENT DOCUMENTS 5,233,265  8/1993  Takasaki et al. .
5,289,520  2/1994  Pellegrino et al. ................. 378/37

Primary Examiner—Edward P. Westin
Assistant Examiner—Jacqueline M. Steady
Attorney, Agent, or Firm—Herbert M. Shapiro

[57] ABSTRACT

An improved X-ray and gamma ray sensitive Vidicon tube having a photoconductor deposited substrate cooled by means of an internal thermoelectric coolers and a heat sink. The cooled photoconductor has a higher resistivity and lower conductivity and hence the device exhibits less dark current.

19 Claims, 3 Drawing Sheets

COOLED X-RAY SENSITIVE PHOTOCONDUCTOR

FIELD OF THE INVENTION

This invention relates to X-ray imaging apparatus having a photoconductive sensor or target.

BACKGROUND OF THE INVENTION

There are a variety of X-ray sensitive materials which may be used in X-ray imaging devices such as Vidicon tubes. Typical among them is thallium bromide, Tl Br, which is characterized by a high dielectric constant (≈30) and excellent X-ray sensitivity. (Others are thallium iodide, thallium bromo-iodide, lead bromide and lead iodide.) However, these materials, exemplified by thallium bromide, have been shown to exhibit high electrical conductivity at ambient temperature (say, 27° C.) which produces an acceptable dark current. The ionic conductivity of thallium bromide is highly temperature dependent and the ionic conductivity can be reduced to acceptable levels by active cooling.

SUMMARY OF THE INVENTION

The ionic conductivity of Tl Br may be expressed approximately as $$\sigma_{ionic} = \frac{9.34 \times 10^5 (S/cm) K°}{T} e^{(-.785\, eV/KT)}$$

For several typical temperatures, the conductivity and resistivity of Tl Br are as follows:

| Temperature T°K. | Conductivity σ | Resistivity e |
| --- | --- | --- |
| 300 | $2 \times 10^{-10}$ | $4.8 \times 10^9$ Ω Cm |
| 280 | $2.6 \times 10^{-11}$ | $3.9 \times 10^{10}$ |
| 260 | $2.3 \times 10^{-12}$ | $4.4 \times 10^{11}$ |
| 250 | $5.8 \times 10^{-13}$ | $1.7 \times 10^{12}$ |

Thus, at 50 degrees below ambient temperature, the resistivity is increased to the $10^{12}$ ohm-centimeter range and dark current is significantly reduced.

In a typical vidicon tube, the heat input to the photoconductor target is radiation from adjacent components such as the front window and rear field mesh. An analysis for an 8"×8" target showed that the radiative heat input at −25° C. would be around 3 watts. Since the thermoelectric cooler is about 10% efficient, the total power dissipation will be about 10×3, or 30 watts.

BRIEF DESCRIPTION OF AN ILLUSTRATIVE EMBODIMENT OF THE INVENTION

In accordance with the principles of the present invention, X-ray sensitive substances are made operationally efficient by actively cooling the x-ray transparent substrate on which they are deposited. In the arrangements of the present invention, thermoelectric coolers are used to cool the substrate. Thermoelectric coolers of the type used in the embodiments of the present invention are commercially available. One source of such thermoelectric coolers is Marlow Industries, Garlon, Tex.

DESCRIPTION OF THE PREFERRED EMBODIMENTS

The charge storage time of X-ray photoconductors can be limited by their electrical properties at ambient temperatures (27° C.). The electrical resistivity of a photoconductor must be made high so that dark current generation during the exposure times of interest, is reduced to acceptable levels. The resistivity of X-ray photocondutor compounds including thallium bromide, thallium iodide, thallium bromo-iodide, lead iodide and others is highly temperature dependent. The preferred embodiments of the present invention effect the cooling of the X-ray sensitive imaging targets to achieve high resistivities, on the order of $10^{12}$ ohm-centimeters and greater.

Imaging devices with sensitivity in the visible and infra-red portions of the spectrum have been cooled to minimize dark cunent. In those cases the detector may be cooled directly or the entire detector housing may be cooled. Because the X-ray sensitive imaging photoconductor may be in intimate contact with an X-ray transparent metal substrate which is an excellent thermal conductor, it is possible to remove heat from the photoconductor through the substrate. By placing the thermoelectric coolers inside the vidicon vacuum, only the substrate and target are cooled and there are no condensation or icing problems as would occur if the target were cooled from the outside.

The X-ray sensitive photoconductor to be cooled is deposited on, or attached to, an X-ray transparent substrate which has sufficient thermal conductivity to allow heat transfer to the edge of the X-ray sensing area. The substrate can be made of a metal such as beryllium or aluminum depending on the energy of the X-rays to be imaged. A single (or series of) thermoelectric coolers are positioned around the circumference of the metal substrate. The thermoelectric coolers reduce the temperature of the substrate which in turn raises the resistivity of the X-ray sensitive photoconductor thus reducing dark current to an acceptable level.

X-ray sensitive imaging photoconductors may be used in conjunction with solid state readout devices and electron beam scanned image tubes. The cooling technique described herein is applicable to both types of imaging devices.

There are two components to electrical conductivity in photoconductor compounds: electronic and ionic. Electronic conductivity is normally very low and is not a problem at ambient temperatures. The dominant conduction mechanism in thallium bromide at ambient temperature is ionic and is expressed by the equation $$r = 1.8 \times 10^{-6} * T * \exp(0.785\, eve/kT)$$

where r is the resistivity in ohm-centimeters, T is given in degrees Kelvin and k is Boltman's constant $8.6 \times 10^{-5}$ eV/degree K. Many other X-ray photoconductors behave in a similar manner.

Figure 1:
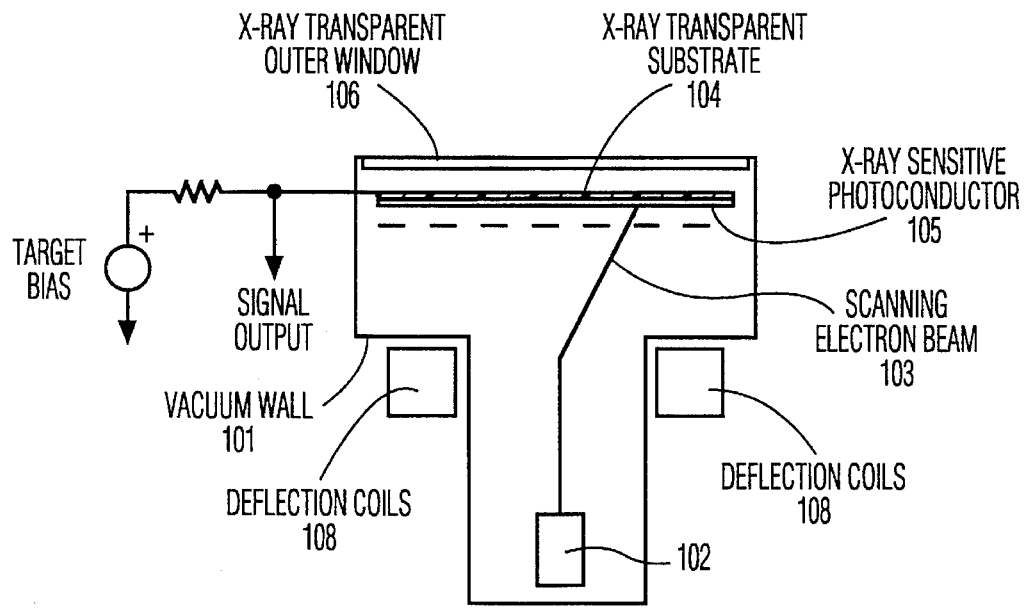
FIG. 1 illustrates a simplified uncooled X-ray sensitive electron beam scanned image tube.

FIG. 1 illustrates a simplified electron beam image tube which employs a thallium bromide photoconductor target but which does not include a cooling mechanism in accordance with the principles of the present invention. U.S. Pat. No. 5,195,118 issued Mar. 11, 1993 discloses an electron beam image tube like that shown in FIG. 1. Referring to FIG. 1, it is noted that image tube 100 is defined by an outer structure including vacuum wall 101 and X-ray transparent outer window 106. Scanning electron beam generator 102 produces the electron beam 103. The deflection coils 108, are driven to cause the electron beam to scan the X-ray sensitive photoconductor 105 in a prescribed pattern. The scanning electron beam 103 impinges on X-ray sensitive photoconductor 105 which has been deposited in accordance with well-known techniques on X-ray transparent substrate 104. Field mesh 107 decelerates the scanning electron beam 103.

Figure 2:
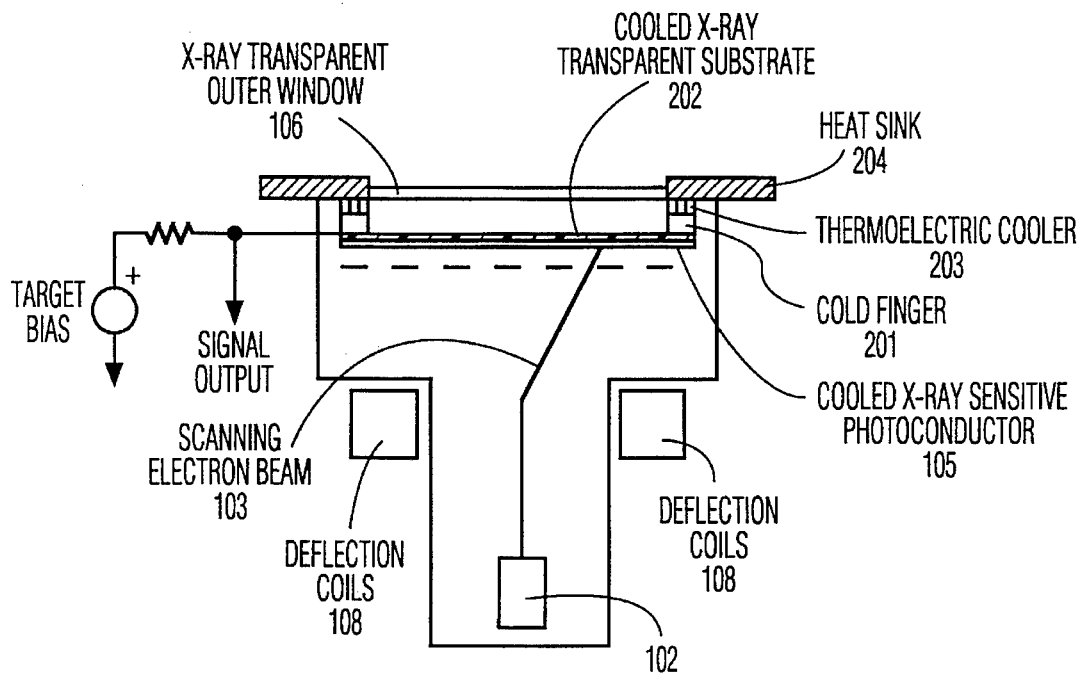
FIG. 2 illustrates an X-ray sensitive electron beam scanned image tube with thermoelectrically cooled target.

FIG. 2 shows an X-ray sensitive electron beam image tube similar in operation to that of FIG. 1 but with a thermoelectrically cooled target. In the embodiment illustrated in FIG. 2, a series of thermoelectric coolers are placed in thermal contact with the substrate and a heat sink. The cooled substrate is contained in the evacuated housing which eliminates convective heat loads and condensation. In the case of an electron beam scanned image tube, a vacuum is necessary so that the electrons can be used to read the charge on the photoconductor. The primary heat load in the device is radiation from the surrounding walls which are at ambient temperature. By making the emissivities of those walls very low (less than 0.1) it is possible to reduce this heat load to a few watts or less. Referring, again, to FIG. 2, cold finger 201 is attached to X-ray transparent substrate 202. Cooled X-ray sensitive photoconductor 205 is bonded to substrate 202 in accordance with well-known techniques. Thermoelectric cooler 203 is fixed to cold finger 201 and heat sink 204 is arranged draw heat from cold finger 201. Shunt capacitance which attenuates the signal is minimized by the use of insulating cold fingers, materials made of high thermal, low electrical conductivity substances.

Figure 3A:
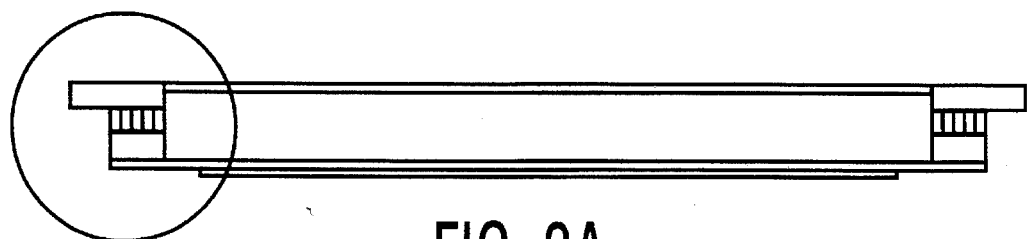
FIG. 3 illustrates the path of heat flow from the substrate to the heat sink.
Figure 3B:
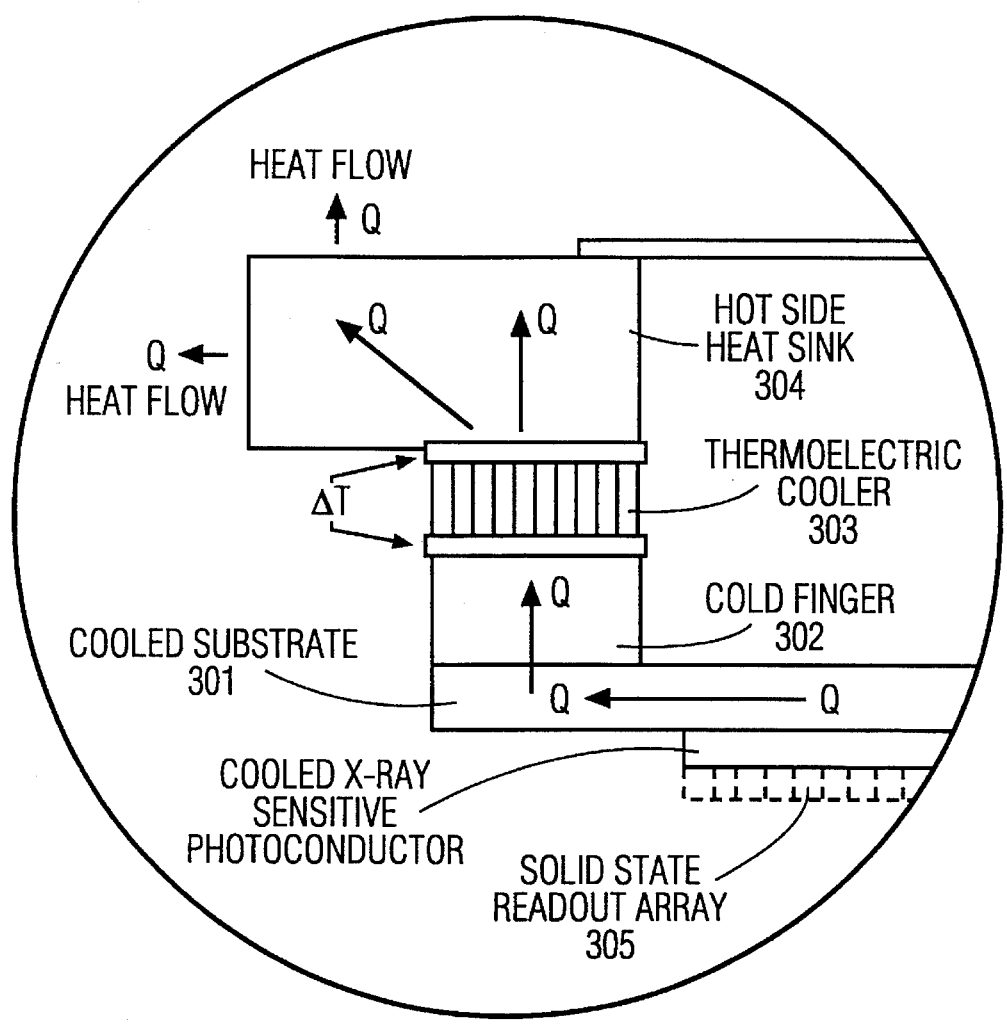

FIG. 3 is a cross-sectional view of the preferred arrangement of the present invention and illustrates the flow of heat (symbolized by the letter "Q"). As illustrated in FIG. 3, the heat flow proceeds from cooled substrate, through cold finger 302, through thermoelectric cooler 303 and into heat sink 304 where it is subsequently dissipated into the surrounding structure.

Figure 4:
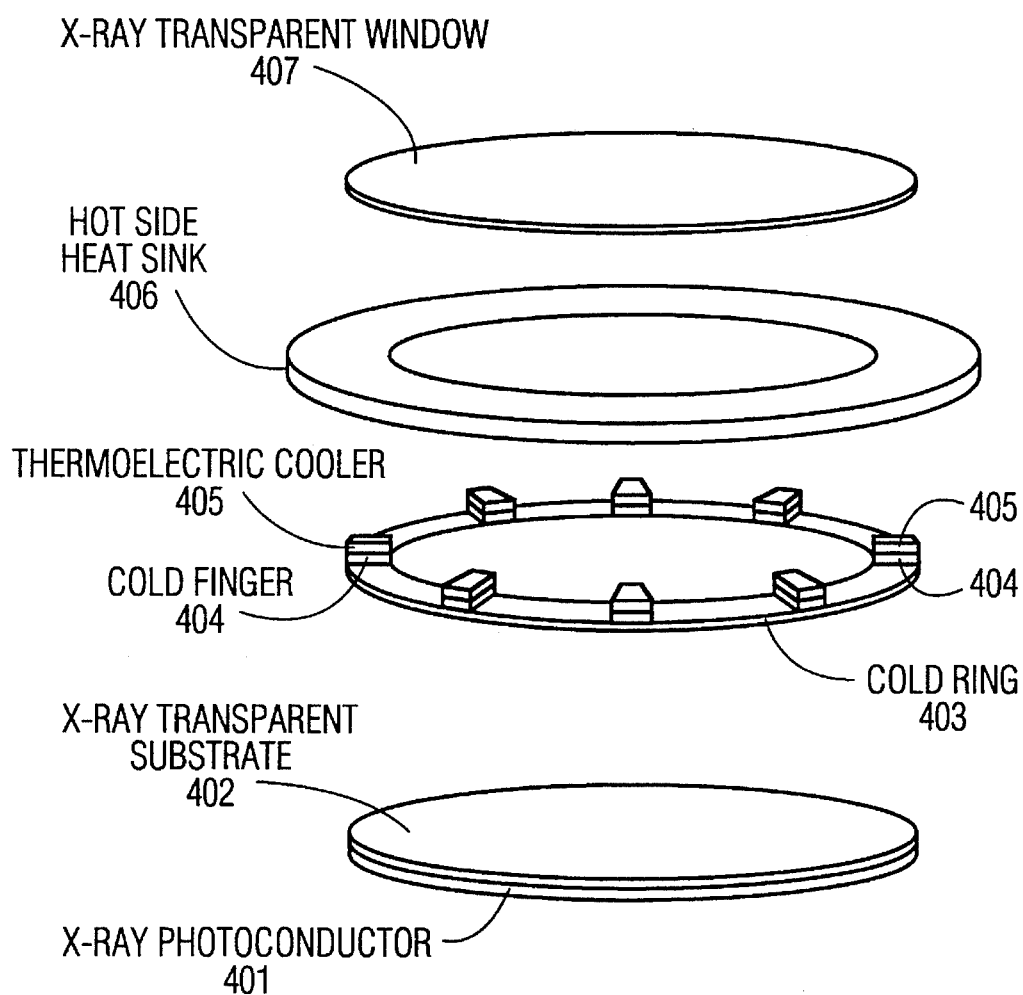
FIG. 4 shows in exploded view, the arrangement of thermoelectric coolers in one embodiment of the principles of the present invention.

The number and arrangement of the thermoelectric coolers depends on the apparatus in which the target photoconductor is being used and is a matter of design choice. FIG. 4, however, illustrates in exploded view one arrangement. In the arrangement of FIG. 4, an X-ray transparent substrate 402 on which an X-ray photoconductor 401 has been deposited, is bonded to the cold ring 403. Cold fingers 404 are bonded to the cold ring 403 on the side opposite the substrate 402. Thermoelectric coolers 405 are bonded to the cold fingers and the hot side heat sink 406. Heat is pumped from the cold fingers 404 to the hot side heat sink 406. The heat generated in the hot side heat sink is dissipated in the assembly housing, (not shown in FIG. 4). The assembly is sealed with the X-ray transparent window 407.

In embodiments in which solid state readout arrays are present, the arrays are positioned adjacent the cooled photoconductor as indicated by the broken line 305 in FIG. 3.

The principles of the present invention have been described with reference to preferred embodiments but these principles apply as well to other arrangements as will be apparent to workers in the art. For example, a cooling liquid may be circulated about the edge of substrate 402 and would constitute a heat sink comparable to the thermoelectric coolers.

What is claimed is:

1. Apparatus for reducing the ionic conductivity of photoconductive material deposited on one side of an X-ray transparent substrate of a high thermal conductivity material comprising at least one thermoelectric cooler positioned on the opposite side of said substrate from said deposited photoconductive material and in thermal contact therewith for cooling said substrate, and a heat sink for dissipating heat from said thermoelectric cooler.

2. Apparatus as in claim 1 further comprising electrically insulating cold finger means positioned between and in communication with said thermoelectric cooler and said substrate.

3. An improved X-ray tube comprising an X-ray transparent substrate of a high thermal conductivity material, said substrate having first and second opposing surfaces on said first surface of which is deposited a photoconductive material, a cold finger insulator in contact with said substrate second surface, at least one thermoelectric cooler having first and second surfaces, said first surface being in contact with said cold finger insulator, and a heat sink in contact with said cooler second surface for dissipating heat at said cooler second surface.

4. Apparatus as in claim 3 wherein said photoconductive material is thallium bromide.

5. Apparatus as in claim 3 wherein said photoconductive material is thallium iodide.

6. Apparatus as in claim 3 wherein said photoconductive material is thallium bromo-iodide.

7. Apparatus as in claim 3 wherein said photoconductive material is lead iodide.

8. Apparatus as in claim 3 wherein said photoconductive material is lead bromide.

9. Apparatus as in claim 3 wherein said substrate comprises a circular disc.

10. Apparatus as in claim 3 wherein said substrate comprises a polygon.

11. Apparatus as in claim 3 wherein said substrate comprises a metal.

12. Apparatus as in claim 3 wherein said cold finger insulator comprises an annular ring affixed to the outer edge of said substrate.

13. Apparatus as in claim 3 also including a solid state readout array adjacent to said photoconductive material.

14. Apparatus as in claim 3 also including a solid state readout array adjacent to said photoconductive material.

15. Apparatus as in claim 14 wherein said photoconductive material is thallium bromo-iodide.

16. Apparatus as in claim 14 wherein said photoconductive material is thallium bromide.

17. Apparatus as in claim 14 wherein said photoconductive material is lead iodide.

18. Apparatus as in claim 14 wherein said photoconductive material is thallium iodide.

19. Apparatus as in claim 14 wherein said photoconductive material is lead bromide.

\* \* \* \* \*